(12) United States Patent
Lu et al.

(10) Patent No.: US 12,109,664 B1
(45) Date of Patent: Oct. 8, 2024

(54) METHOD FOR DETERMINING THICKNESS OF METAL FILM OF WAFER, POLISHING DEVICE, AND MEDIUM

(71) Applicant: Hwatsing (Beijing) Technology Co., Ltd., Beijing (CN)

(72) Inventors: Xinchun Lu, Beijing (CN); Yingming Wu, Beijing (CN); Fangxin Tian, Beijing (CN); Jie Liu, Beijing (CN)

(73) Assignee: Hwatsing (Beijing) Technology Co., Ltd., Beijing (CN)

( * ) Notice: Subject to any disclaimer, the term of this patent is extended or adjusted under 35 U.S.C. 154(b) by 0 days.

(21) Appl. No.: 18/756,304

(22) Filed: Jun. 27, 2024

(30) Foreign Application Priority Data

Jan. 31, 2024 (CN) .......................... 202410128800.5

(51) Int. Cl.
*B24B 37/005* (2012.01)
*G01B 7/06* (2006.01)
*H01L 21/66* (2006.01)

(52) U.S. Cl.
CPC ............ *B24B 37/005* (2013.01); *G01B 7/105* (2013.01); *H01L 22/12* (2013.01)

(58) Field of Classification Search
CPC ....... B24B 7/228; B24B 37/005; B24B 37/04; B24B 37/042; B24B 37/10; B24B 49/02; B24B 49/04; B24B 49/12; H01L 22/12; G01B 7/105

See application file for complete search history.

(56) References Cited

U.S. PATENT DOCUMENTS

2004/0138838 A1 7/2004 Scheiner et al.
2005/0072528 A1 4/2005 Owezarz et al.

FOREIGN PATENT DOCUMENTS

| CN | 1844842 A | * 10/2006 |
| CN | 105659363 A | 6/2016 |
| CN | 106289040 A | 1/2017 |
| CN | 111496665 A | 8/2020 |
| CN | 112864075 A | 5/2021 |

(Continued)

OTHER PUBLICATIONS

First office action of Chinese Application No. 202410128800.5 issued by CNIPA on Mar. 13, 2024.

*Primary Examiner* — Joel D Crandall
(74) *Attorney, Agent, or Firm* — Semicon IP Solutions LLC (57) ABSTRACT

A method for measuring a thickness of a metal film, a polishing device, and a medium are provided. The method includes: determining a reference thickness of the metal film based on measurement signals, the measurement signals being indicative of measured thicknesses of different positions on the metal film; determining sub-adjustment parameters based on an adjustment parameter included in the reference thickness, wherein the adjustment parameter includes sub-adjustment parameters corresponding to topographies of different edges of the metal film; and adjusting, based on the sub-adjustment parameters, a coordinate value of a sampling point in a to-be-processed area of the metal film, processing, based on an adjusted coordinate value, an amplitude of the signal corresponding to the sampling point in the measurement signals, and determining a thickness of the metal film based on the processed signal amplitude.

15 Claims, 5 Drawing Sheets

(56) References Cited

FOREIGN PATENT DOCUMENTS

| | | | | |
|---|---|---|---|---|
| CN | 114705115 A | 7/2022 | | |
| CN | 114993157 A | 9/2022 | | |
| CN | 115541497 A | 12/2022 | | |
| CN | 116295105 A | 6/2023 | | |
| CN | 116772703 A | 9/2023 | | |
| JP | 2004525521 A | * 8/2004 | ........... | H01L 21/304 |

* cited by examiner

METHOD FOR DETERMINING THICKNESS OF METAL FILM OF WAFER, POLISHING DEVICE, AND MEDIUM

CROSS-REFERENCE TO RELATED APPLICATION

The present disclosure is a continuation of Chinese application No. 202410128800.5 and entitled "METHOD AND APPARATUS FOR DETERMINING THICKNESS OF METAL FILM OF WAFER, POLISHING DEVICE, AND MEDIUM", filed on Jan. 31, 2024, the entirety of which is hereby incorporated by reference.

TECHNICAL FIELD

Embodiments of the present disclosure relate to the field of semiconductor manufacturing technologies, and in particular, to a method for measuring a thickness of a metal film of a wafer, a polishing device, and a medium.

BACKGROUND

To accurately determine a topography of a metal film on a surface of a wafer, in the conventional technology, a thickness of the metal film on the surface of the wafer is usually measured by using an eddy current sensor, and the shape of the metal film on the surface of the wafer is determined by using the measured thickness of the metal film. However, due to a basic measurement principle of the eddy current sensor, when an edge thickness of the metal film on the wafer is measured by using the conventional technology, the measurement is inevitably affected by a magnetic field loss, causing measurement signal collected by the eddy current sensor to be attenuated.

To resolve this problem, in a related technology, an attenuation function of a measurement signal is established, and a measurement signal corresponding to an edge of a metal film is recovered according to the attenuation function, to obtain a recovered signal. However, the topography of an edge of the metal film also affects attenuation of the measurement signal. The attenuation function established in the related technology is generally a fixed theoretical function. When the attenuation function is used to calculate attenuation of the measurement signal, only one attenuation result can be calculated regardless of a type of the topography of the edge the metal film. That is, the attenuation function cannot be used to fit an attenuation change of the measurement signal when the topography of the edge of the metal film varies, causing the recovered signal obtained based on the attenuation function to often incur a relatively large error.

SUMMARY

In view of this, embodiments of the present disclosure provide a method and an apparatus for measuring a thickness of a metal film of a wafer, a polishing device, and a medium, to at least partially resolve the foregoing problems.

According to a first aspect of the embodiments of the present disclosure, a method for measuring a thickness of a metal film of a wafer is provided. The method includes: determining reference thickness of the metal film based on measurement signals collected by an eddy current sensor, wherein the measurement signals are indicative of measured thicknesses of different positions on the metal film; determining an adjustment parameter based on the reference thickness, where the adjustment parameter includes sub-adjustment parameters corresponding to topographies of different edges of the metal film; and adjusting, based on the sub-adjustment parameters included in the adjustment parameter, a coordinate value of a sampling point in a to-be-processed area of the metal film, processing, based on an adjusted coordinate value, an amplitude of the signal corresponding to the sampling point in the measurement signals, and determining a thickness of the metal film based on the processed signal amplitude.

According to a second aspect of the embodiments of the present disclosure, an apparatus for measuring a thickness of a metal film of a wafer is provided, including: a reference thickness determining module, configured to determine a reference thickness of the metal film based on measurement signals collected by an eddy current sensor, wherein the measurement signals are indicative of measured thicknesses of different positions on the metal film; a parameter determining module, configured to determine an adjustment parameter based on the reference thickness, where the adjustment parameter includes sub-adjustment parameters corresponding to topographies of different edges of the metal film under the reference thickness; and a processing module, configured to adjust, based on the sub-adjustment parameters included in the adjustment parameter, a coordinate value of a sampling point in a to-be-processed area of the metal film, process, based on an adjusted coordinate value, an amplitude of the signal corresponding to the sampling point in the measurement signals, and determine a thickness of the metal film based on the processed signal amplitude.

According to a third aspect of the embodiments of the present disclosure, a chemical mechanical polishing device is provided. The mechanical polishing device includes a polishing platen, a carrier head, a slurry supply apparatus, an eddy current sensor, and a controller. The carrier head is configured to load a to-be-polished wafer and press the wafer against a polishing pad on the polishing platen, and the slurry supply apparatus is configured to supply slurry between the polishing pad and the wafer; the eddy current sensor is configured to measure a reference thickness of a metal film on the wafer; and the controller is configured to execute the method in any one of the foregoing embodiments.

According to the third aspect of the embodiments of the present disclosure, a non-transitory computer storage medium is provided, on which instructions are stored. When the instructions are executed by a processor, the method according to any one of the foregoing embodiments is implemented.

In the embodiments of the present disclosure, based on the reference thickness of the metal film on the wafer, the adjustment parameter that includes the sub-adjustment parameters corresponding to the topographies the different edges of the metal film under the reference thickness can be determined. Based on the sub-adjustment parameters included in the adjustment parameter, the coordinate value of the sampling point in the to-be-processed area on the metal film can be adjusted, and the adjusted coordinate value corresponding to the topography of the edge of the metal film can be obtained. When the amplitude of the signal corresponding to the sampling point in the measurement signals is processed based on the adjusted coordinate value, the relationship between the topography of the edge of the metal film and attenuation of the measurement signals can be accurately fitted by using the adjusted coordinate value, so that the error of processing the amplitude of the signal corresponding to the sampling point can be reduced, and a more accurate processed signal amplitude can be obtained, thereby improving accuracy of measuring the thickness of the metal film on the wafer.

BRIEF DESCRIPTION OF THE DRAWINGS

To describe the technical solutions in the embodiments of the present disclosure or in the conventional technology more clearly, the following briefly describes the accompanying drawings for describing the embodiments or the conventional technology. It is clear that the accompanying drawings in the following description are merely some embodiments recorded in the embodiments of the present disclosure, and a person of ordinary skill in the art may still derive other drawings from these accompanying drawings.

DETAILED DESCRIPTION

To enable a person skilled in the art to understand the technical solutions in the embodiments of the present disclosure, the following the technical solutions in the embodiments of the present disclosure will be described in detail with reference to the accompanying drawings in the embodiments of the present disclosure. It is clear that the described embodiments are only a part rather than all of the embodiments of the present disclosure. Based on the embodiments of the present disclosure, all other embodiments obtained by a person of ordinary skill in the art shall fall within the protection scope of the embodiments of the present disclosure.

It should be understood that although the terms "first", "second", "third" and the like may be used the present disclosure to describe various types of information, the information is not limited to these terms. These terms are only used to distinguish between information of a same type. For example, without departing from the scope of the present disclosure, "first information" may also be referred to as "second information", and similarly, "second information" may also be referred to as "first information". Depending on the context, for example, the word "if" used herein can be interpreted as "while", "when", or "in response to determining".

According to a first aspect of the embodiments of the present disclosure, a method for measuring a thickness of a metal film of a wafer is provided, to at resolve the foregoing problems.

The method provided in the embodiments of the present disclosure may be used to measure a thickness of a metal film on a wafer when a chemical mechanical polishing device polishes the metal film on the wafer. Chemical mechanical polishing (CMP) is also referred to as chemical mechanical planarization (CMP), and is a global planarization processing technology for ultra-precision surfaces, so that chemical and mechanical polishing of a wafer can be accomplished with a chemical and mechanical joint action.

Figure 1:
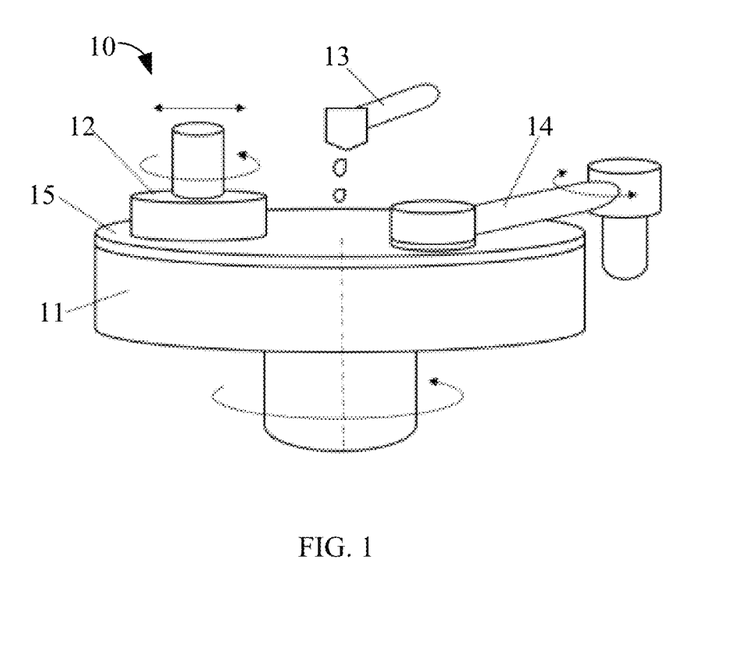
FIG. 1 is a schematic diagram of a structure of a chemical mechanical polishing device according to an embodiment of the present disclosure.

As shown in FIG. 1, a chemical mechanical polishing device 10 may include a polishing platen 11, a carrier head 12, slurry supply apparatus 13, and a conditioner 14. The carrier head 12 loads a to-be-polished wafer, and presses a metal film on the wafer against a polishing pad 15 on the polishing platen 11. The slurry supply apparatus 13 supplies slurry between the polishing pad 15 and the wafer. The conditioner 14 is configured to condition a surface of the polishing pad 15. Accordingly, the method for measuring a thickness of a metal film of a wafer, provided in the embodiments of the present disclosure, can be used to measure a thickness of the metal film loaded by the carrier head 12.

The following describes in detail, with reference to the accompanying drawings, the method for measuring a thickness of a metal film of a wafer, provided in the embodiments of the present disclosure.

Figure 2:
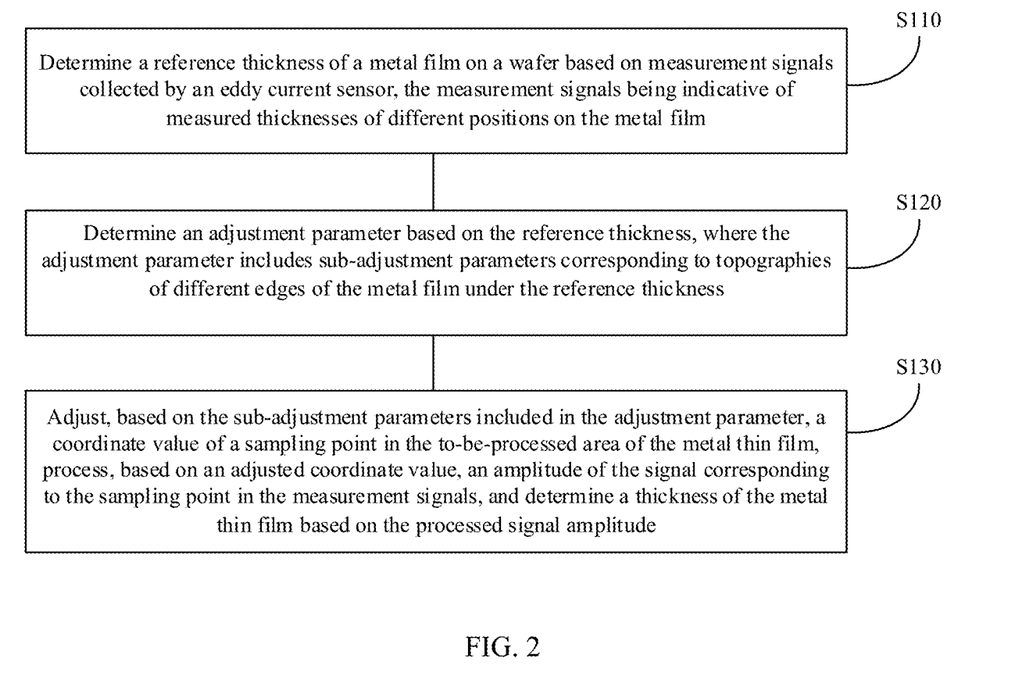
FIG. 2 is a step flowchart of a method for measuring a thickness of a metal film of a wafer according to an embodiment of the present disclosure.

As shown in FIG. 2, an embodiment of the present disclosure provides a method for measuring a thickness of a metal film of a wafer, including the following steps:

S110: Determine a reference thickness of the metal film based on measurement signals collected by an eddy current sensor. The measurement signals are indicative of the measured thicknesses of different positions on the metal film.

It should be understood that, when measuring a thickness of the metal film, the eddy current sensor can excite an alternating electromagnetic field in the metal film, and measure changes of induced electromotive forces produced by a mutual inductance effect caused by the metal film of different thicknesses. When other conditions remain unchanged, there is a one-to-one mapping between the induced electromotive forces and the thicknesses of the metal film. Therefore, the measurement signals collected by the eddy current sensor may indicate the measured thicknesses at different positions on the metal film.

The reference thickness of the metal film may be used as a reference for determining an edge topography of the metal film. For example, the reference thickness may be a thickness of a relatively flat area of the metal film, or the like.

S120: Determine an adjustment parameter based on the reference thickness, where the adjustment parameter includes sub-adjustment parameters corresponding to topographies of different edges of the metal film under the reference thickness.

The Edge topography of the metal film may be classified based on a difference between an edge thickness of the metal film and the reference thickness. For example, when the difference between the edge thickness of the metal film and the reference thickness falls within (−50 angstroms, 50 angstroms), the edge topography of the metal film may be classified as being flat (or as a a first edge topography); when the difference between the edge thickness of the metal film and the reference thickness is greater than 200 angstroms, the topography of the edge of the metal film may be classified as being upwardly bending (or as a second edge topography); and when the difference between the edge thickness of the metal film and the reference thickness is less than −200 angstroms, the topography of the edge of the metal film may be classified as being downwardly bending (or as a third edge topography); and the like. 1 angstrom=1*10$^{-10}$ m.

It should be understood that the edge thickness of the metal film may be a thickness of a to-be-processed area of the metal film.

In this embodiment of the present disclosure, a file on the relationship between the reference thickness and the adjustment parameter may be preset, for example, a mapping table that includes a mapping between the reference thickness and the adjustment parameter. The file of the relationship between the reference thickness and the adjustment parameter may include sub-adjustment parameters corresponding to topographies of different edges of the metal film under each reference thickness. Therefore, a corresponding sub-adjustment parameter may be queried from the file of the relationship between the reference thickness and the adjustment parameter based on the reference thickness of the metal film, to determine the adjustment parameter.

S130: Adjust, based on the sub-adjustment parameters included in the adjustment parameter, a coordinate value of a sampling point in the to-be-processed area on the metal film, process, based on an adjusted coordinate value, an amplitude of the signal corresponding to the sampling point in the measurement signals, and determine a thickness of the metal film based on the processed signal amplitude.

The to-be-processed area on the metal film is an area where the sampling point whose measurement signal attenuates is located. The to-be-processed area is related to the performance of the eddy current sensor and the metal type of the metal film, and may be determined by using the eddy current sensor to actually measure a corresponding metal film sample.

Figure 3:
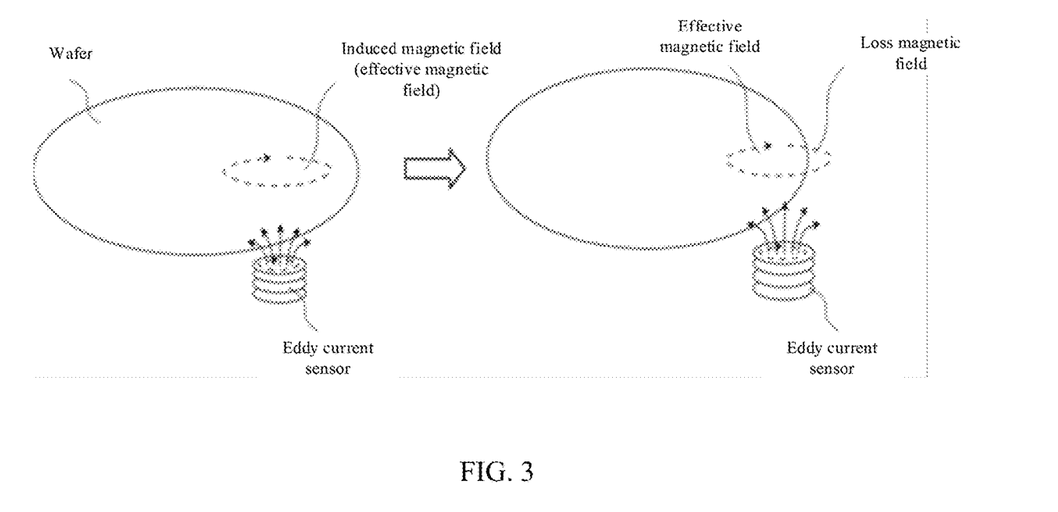
FIG. 3 is a schematic diagram of measurement of an eddy current sensor.

FIG. 3 shows a schematic diagram of attenuation of the measurement signals of the eddy current sensor. A dashed line with an arrow in FIG. 3 indicates an induced magnetic field of the eddy current sensor. As shown on the left side of FIG. 3, when the measurement location of the eddy current sensor is close to the center of the wafer, the induced magnetic field of the eddy current sensor is an effective magnetic field that overlaps the wafer. As shown on the right side of FIG. 3, when the measured position of the eddy current sensor is close to the periphery of the wafer, the induced magnetic field includes an effective magnetic field that overlaps the wafer and a loss magnetic field that does not overlap the wafer, resulting in the attenuation of the measurement signals.

Figure 4:
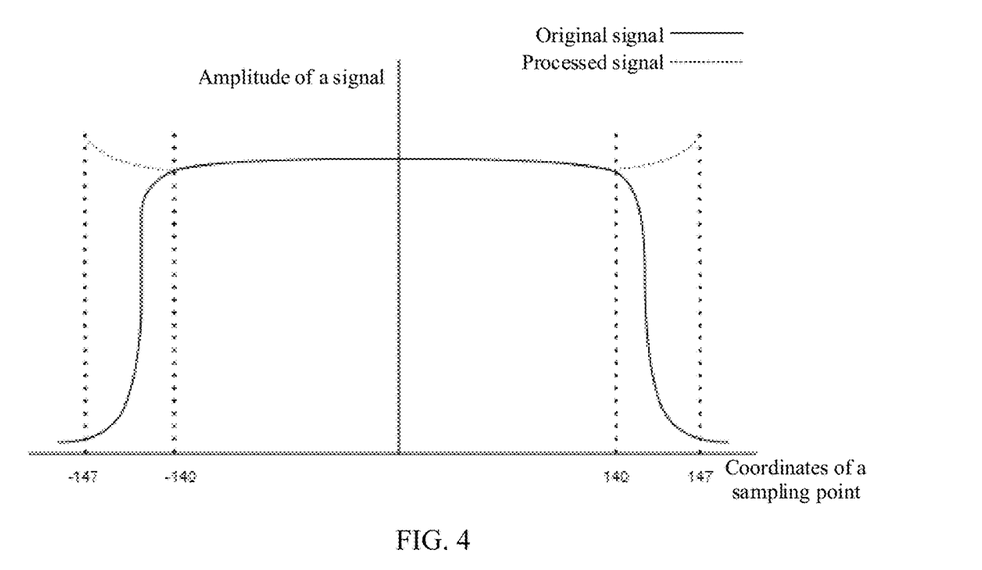
FIG. 4 is a diagram comparing the processed signal amplitude and the original signal amplitude of a sampling point according to an embodiment of the present disclosure.

The coordinate value of the sampling point may be a distance between the sampling point and the central axis of the wafer, or a distance between the sampling point and a parallel line of the central axis of the wafer. For example, the comparison between the processed signal amplitude and the original signal amplitude of the sampling point is shown in FIG. 4. The span (−147, −140) and (140, 147) of horizontal coordinates are the coordinate span of the to-be-processed area.

When the topography of the edge of the metal film is not flat, a position of the sampling point in the to-be-processed area may vary compared with the topography of a flat edge, thereby affecting the measurement signals collected by the eddy current sensor. In this embodiment of the present disclosure, the coordinate value of the sampling point in the to-be-processed area may be adjusted with different degrees based on the different sub-adjustment parameters in the adjustment parameter, to obtain a coordinate value corresponding to an actual position of the sampling point.

In a feasible implementation, when the amplitude of the signal corresponding to the sampling point in the to-be-processed area in the measurement signals is processed, the adjusted coordinate value may be used to calculate an attenuation coefficient of the amplitude of the signal corresponding to the sampling point, and the amplitude of the signal corresponding to the sampling point is divided by the attenuation coefficient to obtain the processed amplitude of the signal. The attenuation coefficient is an attenuation multiple of the amplitude of the measurement signal. The attenuation coefficient may be calculated by using a function of fitting an attenuation change of a measurement signal. For a specific process of fitting the attenuation change of the measurement signal, related technologies may be referred to. Details will not be described herein.

In this embodiment of the present disclosure, based on the reference thickness of the metal film on the wafer, the adjustment parameter that includes the sub-adjustment parameters corresponding to the topographies the different edges of the metal film under the reference thickness can be determined. Based on the sub-adjustment parameters included in the adjustment parameter, the coordinate value of the sampling point in the to-be-processed area on the metal film can be adjusted, and the adjusted coordinate value corresponding to the topography of the edge of the metal film can be obtained. When the amplitude of the signal corresponding to the sampling point in the measurement signals is processed based on the adjusted coordinate value, the relationship between the topography of the edge of the metal film and attenuation of the measurement signals can be accurately fitted by using the adjusted coordinate value, so that the error of processing the amplitude of the signal corresponding to the sampling point can be reduced, and a more accurate processed amplitude of the signal can be obtained, thereby improving accuracy of measuring the thickness of the metal film on the wafer.

In some optional embodiments, the determining the reference thickness of the metal film based on the measurement signals collected by the eddy current sensor includes:

determining, from the measurement signals, an amplitude of the signal corresponding to a sampling point in a reference area on the metal film, wherein the reference area does not intersect the to-be-processed area; and calculating, based on the amplitude of the signal corresponding to the sampling point in the reference area, an average value of measured thicknesses corresponding to all sampling points in the reference area, and determining a calculation result as the reference thickness.

The reference area of the metal film may be a relatively flat area of the metal film. The reference area is related to the performance of the eddy current sensor and the metal type of the metal film, and may be determined by using the eddy current sensor to actually measure a corresponding metal film sample.

In this embodiment of the present disclosure, an average value of measured thicknesses corresponding to all sampling points in the reference area is calculated based on the amplitude of the signal corresponding to the sampling point in the reference area on the metal film, and the calculated average value is determined as a reference thickness, so that the determined reference thickness can effectively represent the thickness of the metal film, thereby better being a reference value of the thickness of the metal film.

In some optional embodiments, the adjusting, based on the adjustment parameter, a coordinate value of a sampling point in the to-be-processed area of the metal film, and processing, based on an adjusted coordinate value, an amplitude of the signal corresponding to the sampling point in the measurement signals includes:

determining a first sub-adjustment parameter from a plurality of sub-adjustment parameters included in the adjustment parameter, and determining a thickness difference range corresponding to the first sub-adjustment parameter, where optionally, the first sub-adjustment parameter may be a sub-adjustment parameter corresponding to a specific topography of an edge of the metal film in the adjustment parameter, for example, the first sub-adjustment parameter may be a sub-adjustment parameter corresponding to the foregoing topography of a flat edge, an upwardly bending edge, a downwardly bending edge, or the like;

determining the first sub-adjustment parameter as a target sub-adjustment parameter, and determining the thickness difference range corresponding to the first sub-adjustment parameter as a target thickness difference range;

adjusting, based on the target sub-adjustment parameter, the coordinate value of the sampling point in the to-be-processed area, to obtain an intermediate coordinate value;

processing, based on the intermediate coordinate value, the amplitude of the signal corresponding to the sampling point in the measurement signals, to obtain an intermediate amplitude of the signal, and determining, based on the intermediate amplitude of the signal, a thickness corresponding to the sampling point;

when a thickness difference between the thickness corresponding to the sampling point and the reference thickness falls within the target thickness difference range, the intermediate amplitude of the signal corresponding to the sampling point is determined as the processed amplitude of the signal. A preset thickness difference range may be set based on a topography of an edge of the metal film corresponding to the target sub-adjustment parameter. For instance, when the difference between the thickness of the edge of the metal film and the reference thickness falls within (−50 angstroms, 50 angstroms), the topography of this edge is classified as the first edge topography, and the target sub-adjustment parameter is a sub-adjustment parameter corresponding to the first edge topography, then (−50 angstroms, 50 angstroms) may be used as the preset thickness difference range.

when the difference between the thickness corresponding to the sampling point and the reference thickness falls outside the target thickness difference range, determining, based on the difference between the thickness corresponding to the sampling point and the reference thickness, a second sub-adjustment parameter from the plurality of sub-adjustment parameters included in the adjustment parameter, and determining, as the processed amplitude of the signal, an intermediate amplitude of the signal obtained when the second sub-adjustment parameter is used as the target sub-adjustment parameter.

In this embodiment of the present disclosure, the first sub-adjustment parameter may be determined from the plurality of sub-adjustment parameters included in the adjustment parameter, the thickness difference range corresponding to the first sub-adjustment parameter is also determined, the first sub-adjustment parameter is used as the target sub-adjustment parameter, the thickness difference range corresponding to the first sub-adjustment parameter is determined as the target thickness difference range, the coordinate value of the sampling point in the to-be-processed area on the metal film is adjusted, and the amplitude of the signal corresponding to the sampling point in the to-be-processed area in the measurement signals is processed, to obtain the intermediate amplitude of the signal. After the thickness corresponding to the sampling point is determined based on the intermediate amplitude of the signal, an intermediate amplitude of the signal that can be used as the processed amplitude of the signal can be determined by comparing the thickness corresponding to the sampling point with the preset thickness difference range, to determine the processed amplitude of the signal. The operation of determining the processed amplitude of the signal is simple without a large amount of calculation, which is beneficial for improving efficiency of processing the measurement signals.

In some optional embodiments, when the first sub-adjustment parameter is used as the target sub-adjustment parameter, the thickness difference corresponding to the first sub-adjustment parameter is used as the target thickness difference range, and the determined thickness difference between the thickness corresponding to the sampling point and the reference thickness falls outside the target thickness difference range, the second sub-adjustment parameter may be determined, based on the difference between thickness corresponding to the sampling point and the reference thickness, from the plurality of sub-adjustment parameters included in the adjustment parameter, and a thickness difference range corresponding to the second sub-adjustment parameter is determined. The target sub-adjustment parameter and the target thickness difference range are updated based on the second sub-adjustment parameter and the thickness difference range corresponding to the second sub-adjustment parameter, that is, the second sub-adjustment parameter is determined as an updated target sub-adjustment parameter, and the thickness difference range corresponding to the second sub-adjustment parameter is determined as an updated target thickness difference range. The coordinate value of the sampling point is adjusted again based on the updated target sub-adjustment parameter, to obtain an updated intermediate coordinate value. The amplitude of the signal corresponding to the sampling point in the measurement signals is processed based on the updated intermediate coordinate value, to obtain an updated intermediate amplitude of the signal. The thickness corresponding to the sampling point is determined, based on the updated intermediate amplitude of the signal, and the thickness corresponding to the sampling point is updated. Whether the updated intermediate amplitude of the signal can be determined as the processed signal amplitude is determined based on a difference between the updated thickness corresponding to the sampling point and the reference thickness and the updated target thickness difference range; and when the updated intermediate amplitude of the signal can be determined as the processed signal amplitude, the updated intermediate amplitude of the signal is determined as the processed amplitude of the signal; or when the updated intermediate amplitude of the signal cannot be determined as the processed signal amplitude, the target sub-adjustment parameter, the target thickness difference range, and the intermediate amplitude of the signal continue to be updated until an intermediate amplitude of the signal that can be determined as the processed amplitude of the signal is obtained.

It should be understood that, when determining, based on the difference between the updated thickness corresponding to the sampling point and the reference thickness and the updated target thickness difference range, whether the updated intermediate amplitude of the signal can be determined as the processed amplitude of the signal, when the difference between the updated thickness corresponding to the sampling point and the reference thickness falls within the updated target thickness difference range, the updated intermediate amplitude of the signal can be determined as the processed amplitude of the signal; or when the difference between the updated thickness corresponding to the sampling point and the reference thickness falls outside the updated target thickness difference range, the updated intermediate amplitude of the signal cannot be determined as the processed amplitude of the signal.

Exemplarily, the thickness difference ranges and adjustment parameters corresponding to the topographies of various edge of a metal film having a reference thickness a are shown in the following table.

Table 1 an exemplary table of the thickness difference ranges and the adjustment parameters corresponding to the topographies of various edges of the metal film

| Reference thickness | Edge topographies | Thickness difference ranges | Adjustment parameters |
|---|---|---|---|
| a | first edge topography | (150 angstroms, 200 angstroms] | Sub-adjustment parameter 1 |
|   | second edge topography | (100 angstroms, 150 angstroms] | Sub-adjustment parameter 2 |
|   | third edge topography | (50 angstroms, 100 angstroms] | Sub-adjustment parameter 3 |
|   | fourth edge topography | (0 angstroms, 50 angstroms] | Sub-adjustment parameter 4 |
|   | fifth edge topography | (−50 angstroms, 0 angstroms] | Sub-adjustment parameter 5 |
|   | sixth edge topography | (−100 angstroms, −50 angstroms] | Sub-adjustment parameter 6 |
|   | seventh edge topography | (−150 angstroms, −100 angstroms] | Sub-adjustment parameter 7 |
|   | eighth edge topography | [−200 angstroms, −150 angstroms] | Sub-adjustment parameter 8 |

In some optional embodiments, the first sub-adjustment parameter is a sub-adjustment parameter corresponding to the fourth edge topography. In this case, the sub-adjustment parameter 4 may be determined as the target sub-adjustment parameter, and (0 angstroms, 50 angstroms] is determined as the target thickness difference range. Then, the coordinate value of the sampling point in the to-be-processed area is adjusted based on the sub-adjustment parameter 4, to obtain an intermediate coordinate value. The amplitude of the signal corresponding to the sampling point in the measurement signals is processed based on the intermediate coordinate value, to obtain an intermediate amplitude of the signal, and the thickness corresponding to the sampling point is determined based on the intermediate amplitude of the signal.

When the difference between the thickness corresponding to the sampling point and the reference thickness a falls within (0 angstroms, 50 angstroms], the obtained intermediate amplitude of the signal may be determined as the processed amplitude of the signal.

When the difference between the thickness corresponding to the sampling point and the reference thickness a falls outside (0 angstroms, 50 angstroms], for example, the difference between the thickness corresponding to the sampling point and the reference thickness a is 120 angstroms, the second sub-adjustment parameter may be determined as the sub-adjustment parameter 2 based on the difference of 120 angstroms, the thickness difference range corresponding to the second sub-adjustment parameter is determined as (100 angstroms, 150 angstroms], the target sub-adjustment parameter is updated to the sub-adjustment parameter 2, and the target thickness difference range is updated to (100 angstroms, 150 angstroms]. The coordinate value of the sampling point is adjusted based on the sub-adjustment parameter 2, to obtain an updated intermediate coordinate value. The amplitude of the signal corresponding to the sampling point in the measurement signals is processed based on the updated intermediate coordinate value, to obtain an updated intermediate amplitude of the signal. The thickness corresponding to the sampling point is redetermined based on the updated intermediate amplitude of the signal, and the thickness of the sampling point is updated.

Whether the updated intermediate amplitude of the signal can be determined as the processed amplitude of the signal is determined based on a difference between the updated thickness corresponding to the sampling point and the reference thickness and the updated target thickness difference range (100 angstroms, 150 angstroms].

When the difference between the updated thickness corresponding to the sampling point and the reference thickness falls within (100 angstroms, 150 angstroms], it indicates that the updated intermediate amplitude of the signal can be determined as the processed amplitude of the signal. In this case, the updated intermediate amplitude of the signal can be directly determined as the processed amplitude of the signal.

When the difference between the updated thickness corresponding to the sampling point and the reference thickness a falls outside (100 angstroms, 150 angstroms], for example, the difference between the updated thickness corresponding to the sampling point and the reference thickness a is 80 angstroms, it indicates that the updated intermediate amplitude of the signal cannot be determined as the processed amplitude of the signal. In this case, the target sub-adjustment parameter, the target thickness difference range, and the intermediate amplitude of the signal continue to be updated. For example, based on the foregoing difference of 80 angstroms, the target sub-adjustment parameter may be updated to the sub-adjustment parameter 3, the target thickness difference range may be updated to (50 angstroms, 100 angstroms], and the intermediate amplitude of the signal may be updated to an intermediate amplitude of the signal corresponding to the sub-adjustment parameter 3. It is determined again whether the updated intermediate amplitude of the signal can be determined as the processed amplitude of the signal. When the updated intermediate amplitude of the signal can be determined as the processed amplitude of the signal, the updated intermediate amplitude of the signal is determined as the processed amplitude of the signal; or when the updated intermediate amplitude of the signal cannot be determined as the processed amplitude of the signal, the target sub-adjustment parameter, the target thickness difference range, and the intermediate amplitude of the signal continue to be updated until an intermediate amplitude of the signal that can be determined as the processed amplitude of the signal is obtained.

In this embodiment of the present disclosure, a target sub-adjustment parameter that matches the thickness of the sampling point may be obtained by continuously updating the target sub-adjustment parameter, so that accuracy of determining the target sub-adjustment parameter is improved, and adjustment of the coordinate value of the sampling point by using an inappropriate target sub-adjustment parameter is avoided, thereby ensuring an effect of processing the measurement signals.

In some optional embodiments, if an adjustment parameter corresponding to a same reference thickness have three sub-adjustment parameters, which are sub-adjustment parameters respectively corresponding to a flat edge topography, a topography of an upwardly bending edge, and a topography of a downwardly bending edge, the first sub-adjustment parameter may be a sub-adjustment parameter corresponding to the topography of the flat edge, and the second sub-adjustment parameter is a sub-adjustment parameter corresponding to the topography of the upwardly bending edge or the topography of the downwardly bending edge.

In this embodiment of the present disclosure, the topography of an edge of the metal film may be classified as flat, upwardly bending, and downwardly bending based on the range of the difference between the thickness in the to-be-processed area on the metal film and the reference thickness. In some optional embodiments, when the first sub-adjustment parameter is the sub-adjustment parameter corresponding to the topography of the flat edge, a preset thickness difference range may be set to (−200 angstroms, 200 angstroms).

By using the sub-adjustment parameter corresponding to the topography of the flat edge as the first sub-adjustment parameter, the coordinate value of the sampling point in the to-be-processed area can be adjusted in a relatively balanced manner to obtain a relatively balanced intermediate coordinate value, so that the amplitude of the signal corresponding to the sampling point in the measurement signals can be processed by using the intermediate coordinate value, and an intermediate amplitude of the signal with relatively high adaptability can be obtained, thereby improving accuracy of determining the thickness corresponding to the sampling point.

In some optional embodiments, the coordinate value of the sampling point in the to-be-processed area on the metal film may be adjusted based on the target sub-adjustment parameter using the following formula 1, to obtain an intermediate coordinate value.

$$G(p)=k*(p+b) \quad \text{Formula 1}$$

In formula 1, p is the coordinate value of the sampling point in the to-be-processed area on the metal film, G(p) is the intermediate coordinate value corresponding to sampling point, and k and b are two parameter values included in the target sub-adjustment parameter;

It should be understood that each sub-adjustment parameter in the adjustment parameter may include a corresponding k value and a corresponding b value, so that the target sub-adjustment parameter is determined to include the corresponding k value and the corresponding b value.

In this embodiment of the present disclosure, the coordinate value of the sampling point in the to-be-processed area on the metal film may be adjusted based on the target sub-adjustment parameter through Formula 1, to obtain the intermediate coordinate value, and a calculation process is simple and convenient, thereby significantly improving efficiency of adjusting the coordinate value of the sampling point in the to-be-processed area.

In some optional embodiments, the processing, based on the intermediate coordinate value, the amplitude of the signal corresponding to the sampling point in the measurement signals, to obtain an intermediate amplitude of the signal includes:

determining, based on the intermediate coordinate value corresponding to the sampling point in the to-be-processed area, an attenuation recovery coefficient corresponding to the sampling point; normalizing the attenuation recovery coefficient corresponding to the sampling point, to obtain an attenuation coefficient corresponding to the sampling point; and determining a quotient of the amplitude of the signal corresponding to the sampling point in the measurement signals and the attenuation coefficient corresponding to the sampling point as the intermediate amplitude of the signal corresponding to the sampling point.

It should be understood that intermediate coordinate values of a same sampling point that are obtained based on different target sub-adjustment parameters may be different, resulting in that attenuation recovery coefficients corresponding to the sampling point that are determined based on the intermediate coordinate values fall within different intervals. Therefore, if the attenuation recovery coefficient is directly used to process the amplitude of the signal corresponding to the sampling point, there may be a relatively large processing deviation.

In this embodiment of the present disclosure, after the attenuation recovery coefficient corresponding to the sampling point is determined, the attenuation recovery coefficient corresponding to the sampling point is normalized, so that the obtained attenuation coefficient falls within a unit interval, for example, an interval [0, 1]. In this manner, the problem that the attenuation recovery coefficient may fall within different intervals is addressed, which results in the mitigation of the deviation of processing the amplitude of the signal corresponding to the sampling point.

In some optional embodiments, the attenuation recovery coefficient corresponding to the sampling point in the to-be-processed area may be calculated based on the intermediate coordinate value corresponding to the sampling point in the to-be-processed area using the following formula 2.

$$F(G(p))=e^{\wedge}(G(p))/(e^{\wedge}(G(p))+1) \quad \text{Formula 2}$$

In addition, in some optional embodiments, normalization of the attenuation recovery coefficient corresponding to the sampling point may be performed using the following Formula 3, to obtain the attenuation coefficient corresponding to the sampling point.

$$H(p)=F(G(p))*2\smallint F(G(p)) \quad \text{Formula 3}$$

In formula 3, p is the coordinate value of the sampling point in the to-be-processed area on the metal film, G(p) is the intermediate coordinate value corresponding to the sampling point, F(G(p)) is the attenuation recovery coefficient corresponding to the sampling point, ∫F(G(p)) is used to represent integrating F(G(p)) in the to-be-processed area of the metal film, and H(p) is the attenuation coefficient corresponding to the sampling point.

In this embodiment of the present disclosure, the attenuation recovery coefficient corresponding to the sampling point in the to-be-processed area may be calculated through formula 2, and normalization of the attenuation recovery coefficient corresponding to the sampling point is performed through formula 3, to obtain the attenuation coefficient corresponding to the sampling point. The operation of obtaining the attenuation coefficient may be continuously and automatically completed without manual operation, so that the efficiency of calculating an attenuation coefficient corresponding to each sampling point in the to-be-processed processed area can be significantly improved.

Figure 5:
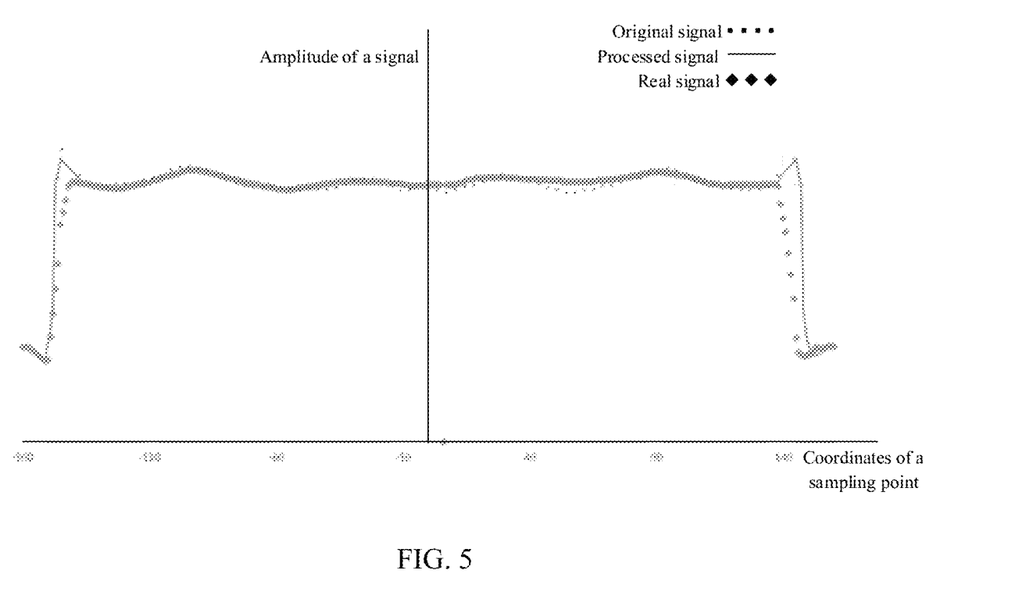
FIG. 5 is a diagram comparing the processed signal amplitude and the actual signal amplitude of the signal of a sampling point according to an embodiment of the present disclosure.

In an embodiment, a thickness measurement signal of a metal film (copper) on a wafer is processed by using the method in the foregoing embodiments. The processed signal amplitude, the original signal amplitude, and the actual signal amplitude of a sampling point are shown in FIG. 5 for comparison. The actual signal amplitude is the amplitude of the unattenuated measurement signal corresponding to the actual thickness of the metal film on the wafer. It can be seen from FIG. 6 that the processed amplitude of the signal of the sampling point is very close to the actual amplitude of the signal of the sampling point, which indicates that the foregoing method can effectively recover the thickness measurement signal.

In a feasible implementation, the foregoing method for measuring a thickness of a metal film of a wafer may further include: pre-calibrating sub-adjustment parameters included in an adjustment parameter under each reference thickness.

For example, when the sub-adjustment parameters included in the adjustment parameter of each reference thickness are calibrated, an eddy current sensor may be used to collect measurement signals to measure the thicknesses of metal films of a plurality of wafer samples. For each wafer sample, a non-attenuation value of a measurement signal of a sampling point in a to-be-processed area on the metal film of the wafer sample may be determined based on the actual thickness of the metal film of the wafer sample. The non-attenuation value of the measurement signal of the sampling point is divided by the measured actual value of the measurement signal of the sampling point collected by the eddy current sensor. The obtained quotient is used as H(p) substituted into the foregoing Formula 3, so that the corresponding k value and the corresponding b value may be calculated according to the Formula 3, the Formula 2, the Formula 1, and a coordinate value of the sampling point. By using the calculated k value and the calculated b value, a sub-adjustment parameter corresponding to the topography of an edge of the metal film under a reference thickness of the metal film can be calibrated. Similarly, sub-adjustment parameters included in adjustment parameters under all reference thicknesses may be calibrated by using corresponding wafer samples.

Optionally, a plurality of wafer samples may be divided into a plurality of groups of wafer samples. Metal films of each group of wafer samples may have the same reference thickness. In addition, the metal films of different wafer samples in each group of the wafer samples may have topographies of different edges, and the different wafer samples in each group of wafer samples may match the classified topographies of all edges. Metal films of wafer samples in different groups may have different reference thicknesses, and all the thickness ranges within the thickness measurement range of the metal films may be involved by the plurality of groups of wafer samples.

According to a second aspect of the embodiments of the present disclosure, an apparatus for measuring a thickness of a metal film of a wafer is provided.

Figure 6:
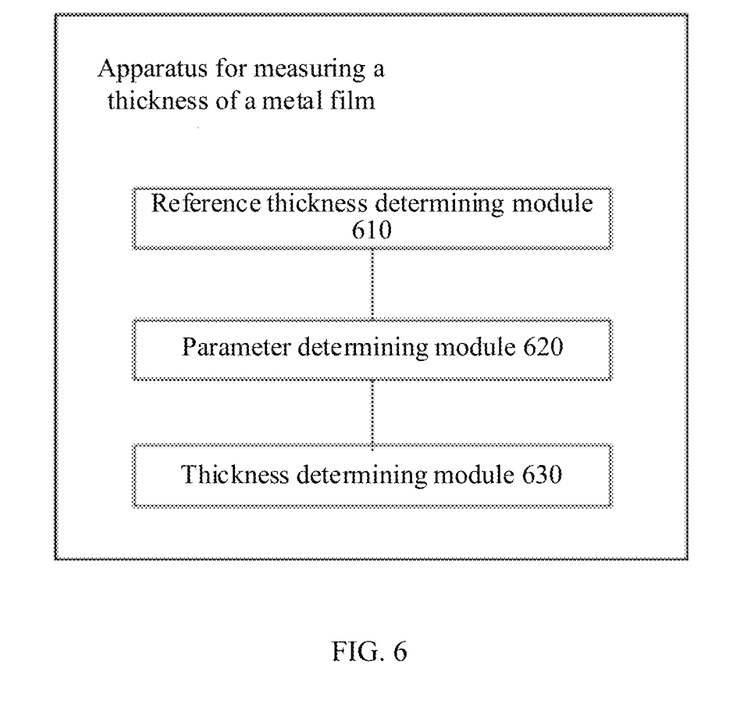
FIG. 6 is a structural block diagram of an apparatus for measuring a thickness of a metal film according to an embodiment of the present disclosure.

As shown in FIG. 6, the apparatus for measuring a thickness of a metal film of a wafer includes:
  a reference thickness determining module 610, configured to determine a reference thickness of the metal film based on measurement signals collected by an eddy current sensor. wherein the measurement signals indicates measured thicknesses of different positions on the metal film;
  a parameter determining module 620, configured to determine an adjustment parameter based on the reference thickness, where the adjustment parameter includes sub-adjustment parameters corresponding to topographies of different edges of the metal film under the reference thickness; and
  a thickness determining module 630, configured to adjust, based on the sub-adjustment parameters included in the adjustment parameter, a coordinate value of a sampling point in a to-be-processed area on the metal film, process, based on the adjusted coordinate value, an amplitude of the signal corresponding to the sampling point in the measurement signals, and determine a thickness of the metal film based on the processed signal amplitude.

The apparatus for measuring the thickness of the metal film in this embodiment is based on a same invention concept as the foregoing embodiments of the method for measuring the thickness of the metal film, and is configured to implement corresponding methods for measuring the thickness of the metal film in a plurality of foregoing method embodiments, and has beneficial effects of the corresponding method embodiments. Details are not described herein again. In addition, for function implementation of all units in the apparatus for measuring a thickness of a metal film of a wafer in this embodiment, refer to descriptions of corresponding parts in the foregoing method embodiments. Details are not described herein again.

According to a third aspect of the embodiments of the present disclosure, a chemical mechanical polishing device is provided. The device includes a polishing platen, a carrier head, a slurry supply apparatus, an eddy current sensor, and a controller. The carrier head is configured to load a to-be-polished wafer and press the wafer against a polishing pad on the polishing platen, and the slurry supply apparatus is configured to supply slurry between the polishing pad and the wafer; the eddy current sensor is configured to measure a reference thickness of a metal film on the wafer; and the controller is configured to execute the method in any one of the foregoing method embodiments. In a feasible implementation, the controller may include a processor and instructions. When the instructions are executed by the processor, the method in any one of the foregoing method embodiments can be implemented.

According to the fourth aspect of the embodiments of the present disclosure, a non-transitory computer storage medium is provided, on which instructions are stored. When the instructions are executed by a processor, the method described in any one of the foregoing method embodiments is implemented. The computer storage medium includes but is not limited to a compact disc read-only memory (CD-ROM), a random access memory (RAM), a floppy disk, a hard disk, a magnetic disk, or the like.

It should be noted that, according to an implementation requirement, the components/steps described in the embodiments of this disclosure may be split into more components/steps, or two or more components/steps or the components/some operations of the steps may be combined into new components/steps, to implement the objectives of the embodiments of this disclosure.

A person of ordinary skill in the art may be aware that the units and the method steps in the examples described with reference to the embodiments disclosed in this specification can be implemented by using electronic hardware or a combination of computer software and electronic hardware. Whether these functions are implemented by hardware or software depends on particular applications and design constraints of the technical solutions. A person skilled in the art may implement the described functions for each particular application by using different methods, but such implementation should not be considered beyond the scope of the embodiments of the present disclosure.

What is claimed is:

1. A method for measuring a thickness of a metal film of a wafer, comprising:
   determining a reference thickness of the metal film based on measurement signals collected by an eddy current sensor, the measurement signals being indicative of measured thicknesses of different positions on the metal film;
   determining an adjustment parameter based on the reference thickness, wherein the adjustment parameter includes sub-adjustment parameters corresponding to a flat edge topography, a topography of an upwardly bending edge, and a topography of a downwardly bending edge respectively;
   adjusting, based on the sub-adjustment parameters included in the adjustment parameter, a coordinate value of a sampling point in a to-be-processed area of the metal film;
   processing, based on an intermediate coordinate value obtained after adjustment of the coordinate value of the sampling point, an amplitude of a signal corresponding to the sampling point in the measurement signals; and
   determining the thickness of the metal film based on the processed signal amplitude,
   wherein the coordinate value of the sampling point is adjusted using the following formula:

$$G(p)=k*(p+b)$$

where, in the formula, p is the coordinate value of the sampling point in the to-be-processed area of the metal film, $G(p)$ is the intermediate coordinate value corresponding to the sampling point, and k and b are two parameter values included in the sub-adjustment parameters; and
   wherein the processing, based on the intermediate coordinate value obtained after adjustment of the coordinate value of the sampling point, the amplitude of the signal corresponding to the sampling point in the measurement signals, comprises:
      determining, based on the intermediate coordinate value corresponding to the sampling point in the to-be-processed area, an attenuation recovery coefficient corresponding to the sampling point;
      normalizing the attenuation recovery coefficient corresponding to the sampling point, to obtain an attenuation coefficient corresponding to the sampling point; and
      dividing the amplitude of the signal corresponding to the sampling point by the attenuation coefficient to obtain the processed signal amplitude.

2. The method according to claim 1, wherein the determining the reference thickness of the metal film on the wafer based on the measurement signals collected by the eddy current sensor comprises:
   determining, from the measurement signals, an amplitude of a signal corresponding to a sampling point in a reference area on the metal film, wherein the reference area does not intersect the to-be-processed area;
   calculating, based on the amplitude of the signal corresponding to the sampling point in the reference area, an average value of measured thicknesses corresponding to all sampling points in the reference area; and
   determining a calculation result as the reference thickness.

3. The method according to claim 1, wherein the adjusting, based on the sub-adjustment parameters included in the adjustment parameter, the coordinate value of the sampling point in the to-be-processed area of the metal film, and processing, based on the intermediate coordinate value obtained after adjustment of the coordinate value of the sampling point, the amplitude of the signal corresponding to the sampling point in the measurement signals, comprise:
   determining a first sub-adjustment parameter from a plurality of sub-adjustment parameters included in the adjustment parameter, and determining a thickness difference range corresponding to the first sub-adjustment parameter;
   determining the first sub-adjustment parameter as a target sub-adjustment parameter, and determining the thickness difference range corresponding to the first sub-adjustment parameter as a target thickness difference range;
   adjusting, based on the target sub-adjustment parameter, the coordinate value of the sampling point in the to-be-processed area of the metal film, to obtain the intermediate coordinate value;
   processing, based on the intermediate coordinate value, the amplitude of the signal corresponding to the sampling point in the measurement signals, to obtain an intermediate amplitude of the signal, and determining, based on the intermediate amplitude of the signal, a thickness corresponding to the sampling point;
   when a difference between the thickness corresponding to the sampling point and the reference thickness falls within the target thickness difference range, determining the intermediate amplitude of the signal corresponding to the sampling point as the processed amplitude of the signal; and
   when the difference between the thickness corresponding to the sampling point and the reference thickness falls outside the target thickness difference range, determining, based on the difference between the thickness corresponding to the sampling point and the reference thickness, a second sub-adjustment parameter from the plurality of sub-adjustment parameters included in the adjustment parameter, and determining, as the processed signal amplitude, the intermediate amplitude of the signal obtained when the second sub-adjustment parameter is used as the target sub-adjustment parameter.

4. The method according to claim 3, wherein the first sub-adjustment parameter is a sub-adjustment parameter corresponding to the flat edge topography, and the second sub-adjustment parameter is the sub-adjustment parameter corresponding to the topography of the upwardly bending edge or the topography of the downwardly bending edge.

5. The method according to claim 1,
   wherein the determining, based on the intermediate coordinate value corresponding to the sampling point in the to-be-processed area, the attenuation recovery coefficient corresponding to the sampling point, comprises:
      calculating, based on the intermediate coordinate value corresponding to the sampling point in the to-be-processed area, the attenuation recovery coefficient corresponding to the sampling point using the following formula:

$$F(G(p))=e^{\wedge}(G(p))/(e^{\wedge}(G(p))+1); \text{ and}$$

wherein the normalizing the attenuation recovery coefficient corresponding to the sampling point, to obtain the attenuation coefficient corresponding to the sampling point, comprises:
      normalizing the attenuation recovery coefficient corresponding to the sampling point using the following formula to obtain the attenuation coefficient corresponding to the sampling point:

$$H(p)=F(G(p))*2/(\int F(G(p)))$$

where, in the formulas, G(p) is the intermediate coordinate value corresponding to the sampling point in the to-be-processed area, F(G(p)) is the attenuation recovery coefficient corresponding to the sampling point, H(p) is the attenuation coefficient corresponding to the sampling point, e^(G(p)) represents e to the power of G(p), and ∫F(G(p)) represents integrating F(G(p)).

6. A chemical mechanical polishing device, comprising:
a polishing platen;
a carrier head;
a slurry supply apparatus;
an eddy current sensor; and
a controller, wherein:
the carrier head is configured to load a to-be-polished wafer and press the wafer against a polishing pad arranged on the polishing platen;
the slurry supply apparatus is configured to supply slurry between the polishing pad and the wafer;
the eddy current sensor is configured to measure a reference thickness of a metal film on the wafer; and
the controller is configured to execute a method for measuring a thickness of the metal film, the method comprising:
determining the reference thickness of the metal film based on measurement signals collected by the eddy current sensor, wherein the measurement signals are indicative of measured thicknesses of different positions on the metal film;
determining an adjustment parameter based on the reference thickness, wherein the adjustment parameter comprises sub-adjustment parameters respectively corresponding to a flat edge topography, a topography of an upwardly bending edge, and a topography of a downwardly bending edge;
adjusting, based on the sub-adjustment parameters included in the adjustment parameter, a coordinate value of a sampling point in a to-be-processed area of the metal film;
processing, based on an intermediate coordinate value obtained after adjustment of the coordinate value of the sampling point, an amplitude of the signal corresponding to the sampling point in the measurement signals; and
determining the thickness of the metal film based on the processed signal amplitude,
wherein the coordinate value of the sampling point is adjusted using the following formula:

$$G(p)=k*(p+b)$$

where, in the formula, p is the coordinate value of the sampling point in the to-be-processed area of the metal film, G(p) is the intermediate coordinate value corresponding to the sampling point, and k and b are two parameter values included in the sub-adjustment parameters; and
wherein the processing, based on the intermediate coordinate value obtained after adjustment of the coordinate value of the sampling point, the amplitude of the signal corresponding to the sampling point in the measurement signals comprises:
determining, based on the intermediate coordinate value corresponding to the sampling point in the to-be-processed area, an attenuation recovery coefficient corresponding to the sampling point;
normalizing the attenuation recovery coefficient corresponding to the sampling point, to obtain an attenuation coefficient corresponding to the sampling point; and
dividing the amplitude of the signal corresponding to the sampling point by the attenuation coefficient to obtain the processed signal amplitude.

7. The device according to claim 6, wherein the determining the reference thickness of the metal film based on a measurement signals collected by the eddy current sensor comprises:
determining, from the measurement signals, an amplitude of the signal corresponding to a sampling point in a reference area of the metal film, wherein the reference area does not intersect the to-be-processed area; and
calculating, based on the amplitude of the signal corresponding to the sampling point in the reference area, an average value of measured thicknesses corresponding to all sampling points in the reference area, and determining a calculation result as the reference thickness.

8. The device according to claim 6, wherein the adjusting, based on the sub-adjustment parameters included in the adjustment parameter, the coordinate value of the sampling point in the to-be-processed area of the metal film, and processing, based on the intermediate coordinate value obtained after adjustment of the coordinate value of the sampling point, the amplitude of the signal corresponding to the sampling point in the measurement signals, comprise:
determining a first sub-adjustment parameter from a plurality of sub-adjustment parameters included in the adjustment parameter, and determining a thickness difference range corresponding to the first sub-adjustment parameter;
determining the first sub-adjustment parameter as a target sub-adjustment parameter, and determining the thickness difference range corresponding to the first sub-adjustment parameter as a target thickness difference range;
adjusting, based on the target sub-adjustment parameter, the coordinate value of the sampling point in the to-be-processed area of the metal film, to obtain the intermediate coordinate value;
processing, based on the intermediate coordinate value, the amplitude of the signal corresponding to the sampling point in the measurement signals, to obtain an intermediate amplitude of the signal, and determining, based on the intermediate amplitude of the signal, a thickness corresponding to the sampling point;
when a difference between the thickness corresponding to the sampling point and the reference thickness falls within the target thickness difference range, determining the intermediate amplitude of the signal corresponding to the sampling point as the processed signal amplitude; and
when the difference between the thickness corresponding to the sampling point and the reference thickness falls outside the target thickness difference range, determining, based on the difference between the thickness corresponding to the sampling point and the reference thickness, a second sub-adjustment parameter from the plurality of sub-adjustment parameters included in the adjustment parameter, and determining, as the processed signal amplitude, an intermediate amplitude of the signal obtained when the second sub-adjustment parameter is used as the target sub-adjustment parameter.

9. The device according to claim 8, wherein the first sub-adjustment parameter is a sub-adjustment parameter corresponding to the flat edge topography, and the second sub-adjustment parameter is a sub-adjustment parameter corresponding to the topography of the upwardly bending edge or the topography of the downwardly bending edge.

10. The device according to claim 6,
wherein the determining, based on the intermediate coordinate value corresponding to the sampling point in the to-be-processed area, the attenuation recovery coefficient corresponding to the sampling point comprises:
calculating, based on the intermediate coordinate value corresponding to the sampling point in the to-be-processed area, the attenuation recovery coefficient corresponding to the sampling point using the following formula:

$$F(G(p))=e^{\wedge}(G(p))/(e^{\wedge}(G(p))+1); \text{ and}$$

wherein the normalizing the attenuation recovery coefficient corresponding to the sampling point, to obtain the attenuation coefficient corresponding to the sampling point, comprises:
normalizing the attenuation recovery coefficient corresponding to the sampling point using the following formula to obtain the attenuation coefficient corresponding to the sampling point:

$$H(p)=F(G(p))*2/(\int F(G(p)))$$

where, in the formulas, G(p) is the intermediate coordinate value corresponding to the sampling point in the to-be-processed area, F(G(p)) is the attenuation recovery coefficient corresponding to the sampling point, H(p) is the attenuation coefficient corresponding to the sampling point, e^(G(p)) represents e to the power of G(p), and ∫F(G(p)) represents integrating F(G(p)).

11. A non-transitory computer storage medium storing instructions which, when executed by a processor, cause the processor to perform a method for measuring a thickness of a metal film of a wafer, the method comprises:
determining a reference thickness of the metal film based on measurement signals collected by an eddy current sensor, the measurement signals being indicative of measured thicknesses of different positions on the metal film;
determining an adjustment parameter based on the reference thickness, wherein the adjustment parameter comprises sub-adjustment parameters respectively corresponding to a flat edge topography, a topography of an upwardly bending edge, and a topography of a downwardly bending edge;
adjusting, based on the sub-adjustment parameters included in the adjustment parameter, a coordinate value of a sampling point in a to-be-processed area of the metal film;
processing, based on an intermediate coordinate value obtained after adjustment of the coordinate value of the sampling point, an amplitude of the signal corresponding to the sampling point in the measurement signals; and
determining the thickness of the metal film based on the processed signal amplitude, wherein the coordinate value of the sampling point is adjusted using the following formula:

$$G(p)=k*(p+b)$$

where, in the formula, p is the coordinate value of the sampling point in the to-be-processed area of the metal film, G(p) is the intermediate coordinate value corresponding to the sampling point, and k and b are two parameter values included in the sub-adjustment parameters; and
wherein the processing, based on the intermediate coordinate value obtained after adjustment of the coordinate value of the sampling point, the amplitude of the signal corresponding to the sampling point in the measurement signals, comprises:
determining, based on the intermediate coordinate value corresponding to the sampling point in the to-be-processed area, an attenuation recovery coefficient corresponding to the sampling point;
normalizing the attenuation recovery coefficient corresponding to the sampling point, to obtain an attenuation coefficient corresponding to the sampling point; and
dividing the amplitude of the signal corresponding to the sampling point by the attenuation coefficient to obtain the processed signal amplitude.

12. The storage medium according to claim 11, wherein the determining the reference thickness of the metal film based on measurement signals collected by an eddy current sensor comprises:
determining, from the measurement signals, an amplitude of the signal corresponding to a sampling point in a reference area of the metal film, wherein the reference area does not intersect the to-be-processed area;
calculating, based on the amplitude of the signal corresponding to the sampling point in the reference area, an average value of measured thicknesses corresponding to all sampling points in the reference area; and
determining a calculation result as the reference thickness.

13. The storage medium according to claim 11, wherein the adjusting, based on the sub-adjustment parameters included in the adjustment parameter, the coordinate value of the sampling point in the to-be-processed area of the metal film, and processing, based on the intermediate coordinate value obtained after adjustment of the coordinate value of the sampling point, the amplitude of the signal corresponding to the sampling point in the measurement signals, comprise:
determining a first sub-adjustment parameter from a plurality of sub-adjustment parameters included in the adjustment parameter, and determining a thickness difference range corresponding to the first sub-adjustment parameter;
determining the first sub-adjustment parameter as a target sub-adjustment parameter, and determining the thickness difference range corresponding to the first sub-adjustment parameter as a target thickness difference range;
adjusting, based on the target sub-adjustment parameter, the coordinate value of the sampling point in the to-be-processed area of the metal film, to obtain the intermediate coordinate value;
processing, based on the intermediate coordinate value, the amplitude of the signal corresponding to the sampling point in the measurement signals, to obtain an intermediate amplitude of the signal, and determining, based on the intermediate amplitude of the signal, a thickness corresponding to the sampling point;

when a difference between the thickness corresponding to the sampling point and the reference thickness falls within the target thickness difference range, determining the intermediate amplitude of the signal corresponding to the sampling point as the processed signal amplitude; and when the difference between the thickness corresponding to the sampling point and the reference thickness falls outside the target thickness difference range, determining, based on the difference between the thickness corresponding to the sampling point and the reference thickness, a second sub-adjustment parameter from the plurality of sub-adjustment parameters included in the adjustment parameter, and determining, as the processed signal amplitude, an intermediate amplitude of the signal obtained when the second sub-adjustment parameter is used as the target sub-adjustment parameter.

14. The storage medium according to claim 13, wherein the first sub-adjustment parameter is a sub-adjustment parameter corresponding to the flat edge topography, and the second sub-adjustment parameter is a sub-adjustment parameter corresponding to the topography of the upwardly bending edge or the topography of the downwardly bending edge.

15. The storage medium according to claim 11,
wherein the determining, based on the intermediate coordinate value corresponding to the sampling point in the to-be-processed area, the attenuation recovery coefficient corresponding to the sampling point comprises:
calculating, based on the intermediate coordinate value corresponding to the sampling point in the to-be-processed area, the attenuation recovery coefficient corresponding to the sampling point using the following formula:

$F(G(p))=e^{\char`\^}(G(p))/(e^{\char`\^}(G(p))+1)$; and wherein the normalizing the attenuation recovery coefficient corresponding to the sampling point, to obtain the attenuation coefficient corresponding to the sampling point comprises:
normalizing the attenuation recovery coefficient corresponding to the sampling point using the following formula to obtain the attenuation coefficient corresponding to the sampling point:

$H(p)=F(G(p))*2/(\int F(G(p)))$ where, in the formulas, G(p) is the intermediate coordinate value corresponding to the sampling point in the to-be-processed area, F(G(p)) is the attenuation recovery coefficient corresponding to the sampling point, H(p) is the attenuation coefficient corresponding to the sampling point, $e^{\char`\^}(G(p))$ represents e to the power of G(p), and $\int F(G(p))$ represents integrating F(G(p)).

* * * * *